(12) United States Patent
Alkaraghouli et al.

(10) Patent No.: US 12,282,051 B2
(45) Date of Patent: Apr. 22, 2025

(54) LITZ WIRE HEALTH MONITORING

(71) Applicant: Hamilton Sundstrand Corporation, Charlotte, NC (US)

(72) Inventors: Ali Alkaraghouli, Solihull (GB); Grzegorz Popek, Birmingham (GB)

(73) Assignee: HAMILTON SUNDSTRAND CORPORATION, Charlotte, NC (US)

( * ) Notice: Subject to any disclaimer, the term of this patent is extended or adjusted under 35 U.S.C. 154(b) by 0 days.

(21) Appl. No.: 17/176,280

(22) Filed: Feb. 16, 2021

(65) Prior Publication Data

US 2021/0285998 A1 Sep. 16, 2021

(30) Foreign Application Priority Data

Mar. 10, 2020 (EP) ..................................... 20275055

(51) Int. Cl.
*G01R 31/11* (2006.01)
*G01R 31/08* (2020.01)
(52) U.S. Cl.
CPC ............ *G01R 31/11* (2013.01); *G01R 31/081* (2013.01)
(58) Field of Classification Search
None
See application file for complete search history.

(56) References Cited

U.S. PATENT DOCUMENTS

| 5,717,337 A * | 2/1998 | Kelly | G01F 23/26 324/533 |
| 5,784,338 A * | 7/1998 | Yankielun | G01N 17/00 367/13 |
| 7,068,042 B2 * | 6/2006 | Allan | G01R 31/58 324/525 |
| 9,244,117 B2 | 1/2016 | Furse et al. | |
| 2004/0183544 A1 | 9/2004 | Allan et al. | |
| 2005/0024210 A1 * | 2/2005 | Maki | G08B 13/2497 340/566 |
| 2005/0270036 A1 * | 12/2005 | Allan | G01R 31/11 324/543 |
| 2006/0038573 A1 * | 2/2006 | Sarkozi | G01R 31/1272 324/536 |
| 2009/0295531 A1 * | 12/2009 | Silva | H01F 27/346 336/221 |

(Continued)

FOREIGN PATENT DOCUMENTS

CN 107037311 A 8/2017
EP 1593981 A2 11/2005

(Continued)

OTHER PUBLICATIONS

Yamaguchi et al.; A High-precision Foamed Coaxial Cable And Manufacturing Method Thereof; Date Published Jun. 22, 2005; CN 1630916 A; CPC H 01 B 13/00 (Year: 2005).*

(Continued)

*Primary Examiner* — Nasima Monsur
(74) *Attorney, Agent, or Firm* — CANTOR COLBURN LLP

(57) ABSTRACT

A system and method for monitoring the health of a Litz wire. This can be done by representing the wire as a transmission line that is terminated at each end. A pulse can be induced in the transmission line and monitored with and using time domain reflectometry (TDR) to monitor the state of strands of the Litz wire.

12 Claims, 1 Drawing Sheet

(56) References Cited

U.S. PATENT DOCUMENTS

2011/0304340 A1* 12/2011 Hall ................. G01R 31/11
                                                      324/533
2016/0306000 A1* 10/2016 Whitlock ............ H05K 9/0069
2019/0027301 A1*  1/2019 Lee ................. H01F 27/306

FOREIGN PATENT DOCUMENTS

EP       1593981 A3    7/2006
GB        617794 A     2/1949

OTHER PUBLICATIONS

European Search Report for Application No. 20275055.0, mailed Sep. 22, 2020, 10 pages.

* cited by examiner

LITZ WIRE HEALTH MONITORING

FOREIGN PRIORITY

This application claims priority to European Patent Application No. 20275055.0 filed Mar. 10, 2020, the entire contents of which is incorporated herein by reference.

TECHNICAL FIELD

The present disclosure is concerned with monitoring the health of Litz wires and especially, but not exclusively, Litz wires used in electric machines.

BACKGROUND

Litz wires are wires used in various electrical applications for carrying AC current. Litz wires comprise several thin wire strands which are then twisted or woven together to form a multistrand conductor. Because of the way the strands are twisted together, each strand is on the outside of the conductor for an equal proportion of the overall length and so the current is equally distributed between the strands which reduces resistance of the strands. Litz wires have reduced losses, due to proximity and skin effect characteristics, particularly at high frequencies.

More recently, designers have begun to use Litz wires to form the coils of electric machines. Litz wires with many strands and small diameter are easy to bend and form into motor windings.

In recent years, electrical machines have been used more in aircraft as there has been a desire for more electrical aircraft (MEA). As this demand for more electrical aircraft and for more power in aircraft has increased, the electrical motors have started to become the primary drive systems in aircraft rather than providing a back-up function. It is, therefore, vital that such machines are robust and reliable.

Many of these motors now use Litz wires as their windings, for improved efficiency and conductivity. A problem with Litz wires is that because they include many very thin strands, the individual strands can break. The stress placed on the Litz wires during and after assembly can weaken the strands. In applications such as electrical machines in aircraft loss of a strand can have serious effects. In such assemblies, failure is not predictable and can cause unplanned delays to carry out repair or replacement.

There is, therefore, a need for a way to monitor the health of Litz wires in a reliable manner, such that the state of the wires can be diagnosed and/or failure can be prognosed.

The present disclosure provides an arrangement and method for monitoring the health of Litz wires especially those used in electric machines.

SUMMARY

In one aspect, the disclosure provides a method of monitoring a Litz wire by representing the wire as a transmission line and using time domain reflectometry (TDR) to monitor the state of the strands of the wire.

Also provided is a Litz wire diagnostic assembly in which a Litz wire to be tested is represented as a transmission line and a TDR system is used to determine the health of the strands of the wire.

In one embodiment, a pulse is injected into the wire to induce an electromagnetic wave that travels along the wire and a voltage is measured across the wire due to the electromagnetic pulse returning along the wire, the measured voltage providing an indication of the health of the wire.

In embodiments, the electromagnetic pulse travels to a terminal at a first end and returns from the terminal at the first end towards a terminal at the second end, and wherein a voltage is measured across the wire as the pulse is returning.

In embodiments, the wire is divided into two or more bundles of strands and wherein a current pulse is injected into a first strand and a voltage is measured across the bundles as an indication of the health of the wire.

DETAILED DESCRIPTION

The described embodiments are by way of example only. The scope of this disclosure is limited only by the claims.

Figure 1:
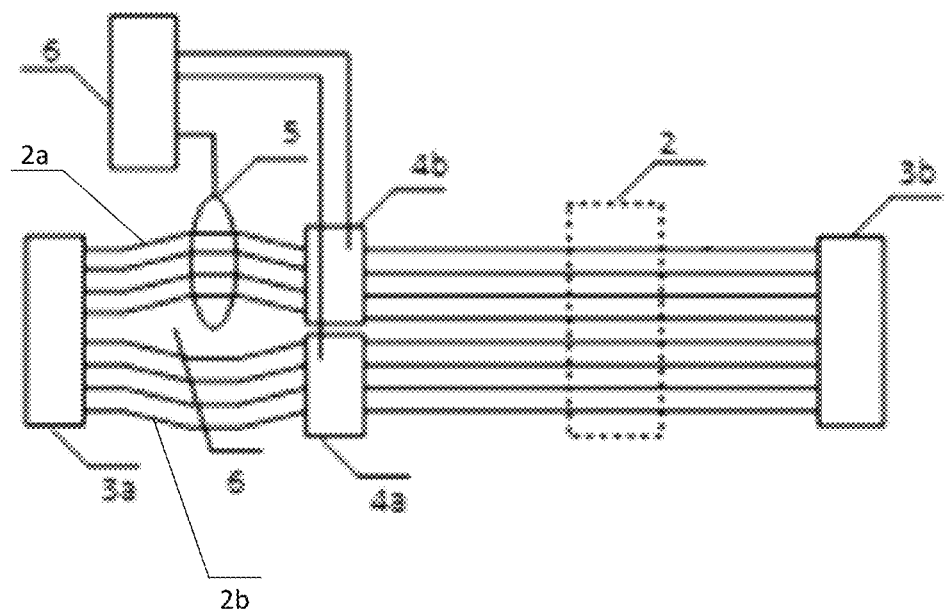
FIG. 1 shows a first arrangement according to the disclosure.
Figure 2:
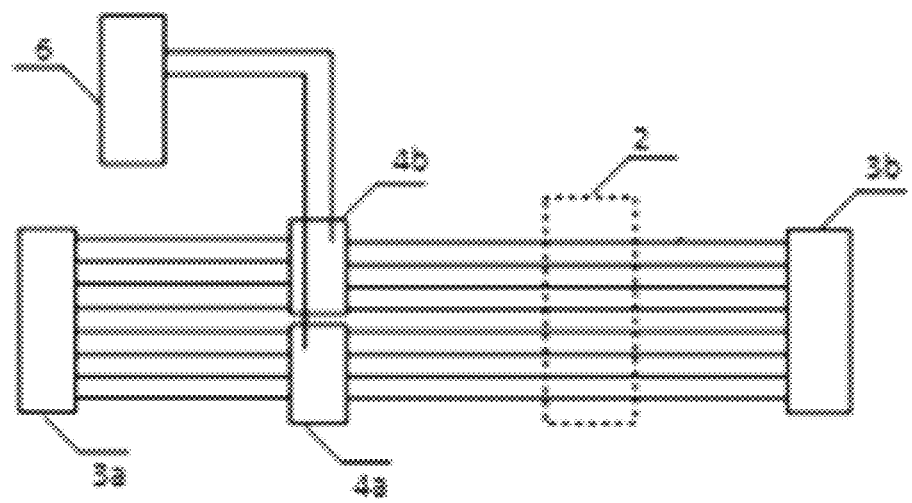
FIG. 2 shows an alternative arrangement according to the disclosure.

As described above Litz wires (2) are made up of multiple strands. The figures show Litz wires 2 used as e.g. windings in an electrical motor. The Litz wires may be used to for many other wound component. The principle of the disclosure can also apply to classical power distribution cables. The Litz wires are used as stator tooth windings terminated at each end with terminals 3a, 3b. FIGS. 1 and 2 show the stator tooth windings when unfolded.

According to the disclosure, to be able to check the health of the wire strands, the windings are formed to effectively recommend a transmission line and are formed such that a homogenous medium is created for electromagnetic waves to propagate and create transmission line effects which can be measured. The measurement will indicate any faults in the wire.

FIG. 1 shows an embodiment using current injection and voltage monitoring. The homogenous medium is created by splitting the strands into at least two groups 2a, 2b. A voltage detection and excitation unit 6 is connected across the two groups, optionally by means of terminals 4a, 4b which may be e.g. clips or electrically conductive terminals to thus create an electrical loop. Whilst the example shows the wire split into two bundles of strands, the wire can be split into more bundles according to the desired accuracy of detection. In some applications, it may be necessary to detect even a slight deterioration in one single strand, in which case the bundle should have fewer (even only two) strands, whereas in other cases, bigger bundles will still be sufficiently reliable.

In this embodiment, current pulses are injected into the strands by e.g. a magnetic coupling 5. This may be a transformer 5, e.g. an air cored transformer such as a Rogowski coil arrangement, or a magnetic based transformer, bt other means of pulse injection may also be used.

The injection coupling 5 is energised by inducing a current pulse in the loop. The pulse then enters the Litz wire 2 and induces an electromagnetic wave which travels in the direction of terminal 3b. When the wave reaches terminal 3b, it is reflected back towards terminal 3a. When the wave reaches terminal 3a, it is sensed by the coupling 5 or by measuring the voltage across terminals 4a, 4b. The time for the wave to travel to terminal 3b and then reflect back to terminal 3a, for a healthy wire, will be known and any deviation from this will be picked up by the measurement at coupling 5 or terminals 4a, 4b.

If there is a fault in one or more of the wire strands of the wire, causing an open circuit or a short circuit, this will cause a discontinuity in the homogenous medium and will cause transmission line effects in that the wave will be partially reflected at the discontinuity before it would normally have been reflected by terminal 3b. This effect will be detected as is known in TDR, and be reported as a fault or deterioration. The more strands that are lost, the greater the discontinuity effect and so the greater the reported fault.

The voltage detection and excitation unit 6 can then evaluate and/or report the fault e.g. via an external device or computer. The voltage detection and excitation unit 6 could be connected to the external device by wire or wirelessly.

The arrangement can include a single voltage detection and excitation unit for all teeth/windings or each tooth could have its own unit located in close proximity. The unit 6 can receive power and/or communication signals by wire or wirelessly.

In an alternative embodiment, as shown in FIG. 2, voltage injection and voltage monitoring is used. Rather than operating by inducing an electromagnetic wave by a current loop, or current injection as in FIG. 1, the electromagnetic wave could be induced by means of voltage excitation. Here a voltage is created by the voltage detection and excitation unit 6 across terminals 4a, 4b which induces the electromagnetic wave. This travels along the wire as described above and the returned signal is measured at the terminals 4a, 4b.

The speed of propagation of the wave is also linked to the dielectric constant of the wire and so TDR measurements can also give an indication of faults in the winding insulation.

Whilst the use of TDR is preferred, it is also possible to determine faults in the wire represented as a transmission line by impedance measurement-increased impedance will be indicative of a strand fault.

The present disclosure thus teaches a system and method that allows reliable diagnosis of Litz wires e.g. as used in electric motors. Loss of strands causing an open circuit and/or strand-to-strand short circuiting can be detected and identified. The arrangement can be easily modified for different applications.

Although described in relation to motor windings using Litz wires, it is believed that the concepts described herein are application to other applications where Litz wires are used.

The invention claimed is:

1. A method of monitoring a Litz wire forming a winding of an electrical motor, the Litz wire comprising a plurality of strands, the method comprising:
    terminating a first end of the plurality strands with a first termination terminal and terminating a second end of the plurality strands with a second termination terminal so that the plurality of strands creates transmission line effects;
    splitting the plurality of strands into at least a first bundle of strands and a second bundle of strands;
    connecting a first measurement terminal to the first bundle and a second measurement terminal to the second bundle;
    wherein the first measurement terminal and the second measurement terminal comprise clips or electrically conductive terminal to create an electrical loop;
    connecting a time domain reflectometry (TDR) device to the first measurement terminal and to the second measurement terminal of that at least two bundles;
    injecting an electromagnetic pulse in the into first bundle with a transformer that is coupled to the first bundle;
    measuring via the TDR device a voltage across the first and second measurement terminals; and
    monitoring the state of strands of the wire based on the measured voltage;
    wherein the electromagnetic pulse induces an electromagnetic wave that travels along the wire strands in the first bundle and the voltage measured across the measurement terminals is due to the electromagnetic pulse returning along the wire, the measured voltage providing an indication of the health of the wire;
    wherein the electromagnetic pulse travels to the first termination terminal at the first end and returns from the first termination terminal at the first end towards the second termination terminal at the second end.

2. The method of claim 1, wherein a current pulse is injected into a first strand and the voltage measured across the first and second terminals is as an indication of the health of the wire.

3. The method of claim 1, wherein a voltage pulse is provided to the wire and the voltage measured across the first and second terminals is as an indication of the health of the wire.

4. The method of claim 1, wherein a greater TDR indicates a greater discontinuity.

5. The method of claim 4, wherein the greater discontinuity indicates that more strands of the Litz wire are short circuited.

6. The method of claim 4, wherein the the greater discontinuity indicates that more strands of the Litz wire are open circuited.

7. A Litz wire diagnostic assembly for Litz wire forming a winding of an electric motor, wherein the Litz wire includes a plurality of strands and is split into at least a first bundle of strands and second bundle of strands, the assembly comprising:
    a first termination terminal to be connected at a first end of the wire and a second termination terminal to be connected at a second end of the wire such that the Litz wire represents a transmission line;
    wherein the wire is separated into a first bundle of strands and a second bundle of strands;
    a first measurement terminal connected to the first bundle;
    a second measurement terminal connected to the second bundle;
    wherein the first measurement terminal and the second measurement terminal comprise clips or electrically conductive terminal to create an electrical loop;
    a time delay reflectometry (TDR) device configured to be connected to the first and second measurement terminals, the TDR device configured excite an electromagnetic pulse into the first bundle that travels to the first termination terminal and returns towards the second termination terminal, the TDR device also being configured to measure a TDR voltage across the first and second measurement terminals, wherein the voltage is used to determine the health of strands of the wire, the TDR device including a magnetic coupling in the form of a transformer connected to the first bundle that excites the electromagnetic pulse into the first bundle;
    wherein the electromagnetic pulse induces an electromagnetic wave that travels along the wire and the voltage measured across the measurement terminals is due to the electromagnetic pulse returning along the wire;

wherein the electromagnetic pulse travels to the first termination terminal and returns from the first termination terminal towards the second termination terminal; and wherein a fault is detected based on a discontinuity in the litz wire.

8. The assembly of claim 7, wherein TDR device excites the electromagnetic pulse by injecting a current pulse into the first bundle.

9. The assembly of claim 7, wherein TDR device excites the electromagnetic pulse by injecting a voltage into the first bundle.

10. The assembly of claim 7, wherein a greater TDR indicates a greater discontinuity.

11. The assembly of claim 8, wherein the greater discontinuity indicates that more strands of the Litz wire are short circuited.

12. The assembly of claim 10, wherein the greater discontinuity indicates that more strands of the Litz wire are open circuited.

\* \* \* \* \*